United States Patent
Kanakasabapathy

(10) Patent No.: US 9,299,705 B2
(45) Date of Patent: Mar. 29, 2016

(54) METHOD OF FORMING SEMICONDUCTOR FINS AND INSULATING FENCE FINS ON A SAME SUBSTRATE

(71) Applicant: International Business Machines Corporation, Armonk, NY (US)

(72) Inventor: Sivananda K. Kanakasabapathy, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/181,781

(22) Filed: Feb. 17, 2014

(65) Prior Publication Data

US 2015/0236018 A1    Aug. 20, 2015

(51) Int. Cl.
*H01L 27/092* (2006.01)
*H01L 21/8238* (2006.01)

(52) U.S. Cl.
CPC .... *H01L 27/0924* (2013.01); *H01L 21/823821* (2013.01)

(58) Field of Classification Search
CPC ............ H01L 29/66545; H01L 29/785; H01L 21/823431; H01L 27/1211; H01L 29/6681; H01L 27/0886; H01L 21/845; H01L 29/76; H01L 27/092; H01L 21/8238; H01L 27/0924; H01L 27/823821
USPC ........... 257/288, E21.002, 365; 438/443, 424
See application file for complete search history.

(56) References Cited

U.S. PATENT DOCUMENTS

| | | | |
|---|---|---|---|
| 7,187,046 B2 | 3/2007 | Wu et al. | |
| 7,723,171 B2 | 5/2010 | Yagishita et al. | |
| 8,035,170 B2 | 10/2011 | Inaba | |
| 8,420,459 B1 | 4/2013 | Cheng et al. | |
| 8,802,565 B2* | 8/2014 | Hartig et al. | 438/669 |
| 8,987,790 B2* | 3/2015 | Cheng et al. | 257/288 |
| 2011/0111596 A1* | 5/2011 | Kanakasabapathy | 438/694 |
| 2012/0299106 A1 | 11/2012 | Mann | |
| 2014/0113432 A1* | 4/2014 | Ching et al. | 438/424 |

* cited by examiner

*Primary Examiner* — Alexander Oscar Williams
(74) *Attorney, Agent, or Firm* — Scully, Scott, Murphy & Presser, P.C.; Steven J. Meyers

(57) ABSTRACT

A semiconductor structure may be formed by forming a first semiconductor fin and a second inactive semiconductor fin above a substrate; depositing a masking layer above the first semiconductor fin and the second semiconductor fin; etching a trench in the masking layer exposing the second semiconductor fin while the first semiconductor fin remains covered by the masking layer; removing the second semiconductor fin to form a fin recess beneath the trench; filling the fin recess with an insulating material to form an insulating fence fin; and removing the masking layer to expose the first semiconductor fin and the insulating fence fin. A third semiconductor fin separating the first semiconductor fin from the second semiconductor fin may also be formed prior to depositing the masking layer and covered by the masking layer. The first semiconductor fin may be a pFET fin and the third semiconductor fin may be an nFET fin.

15 Claims, 5 Drawing Sheets

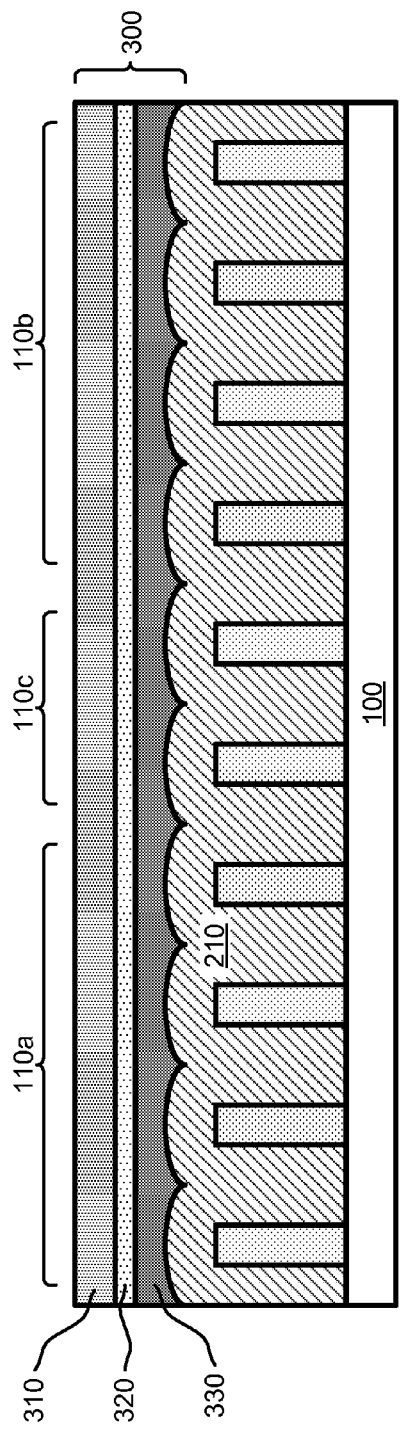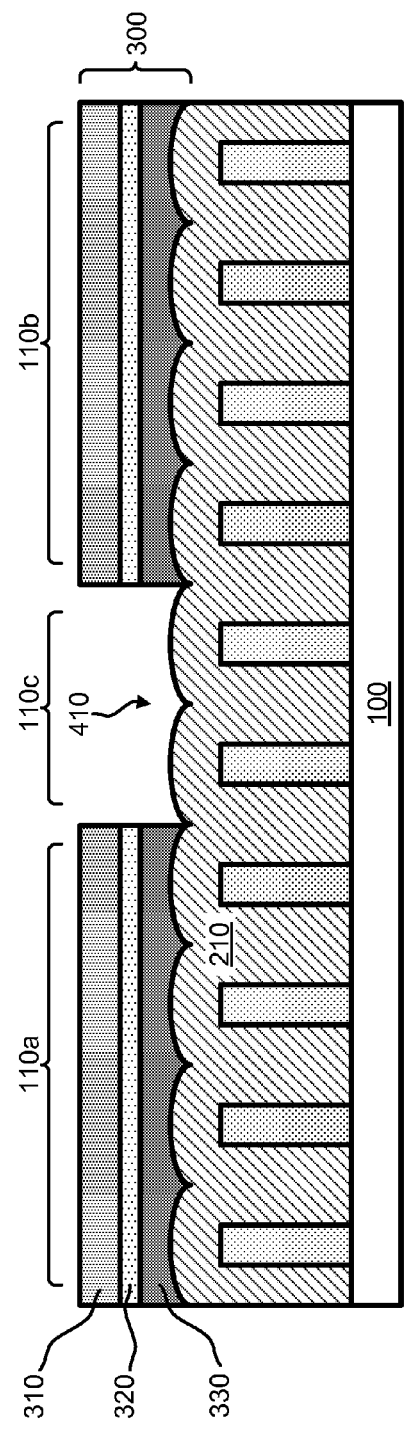

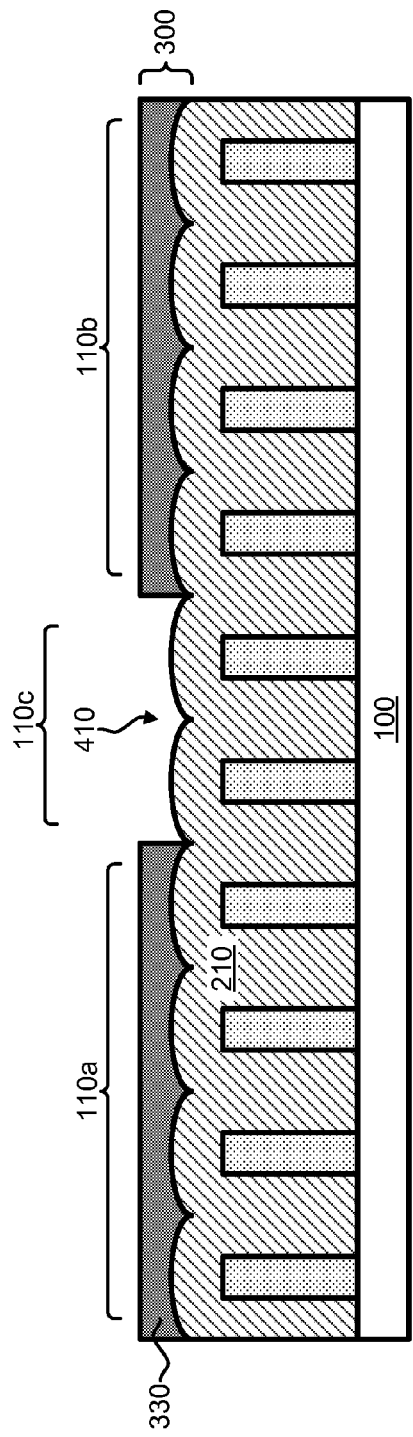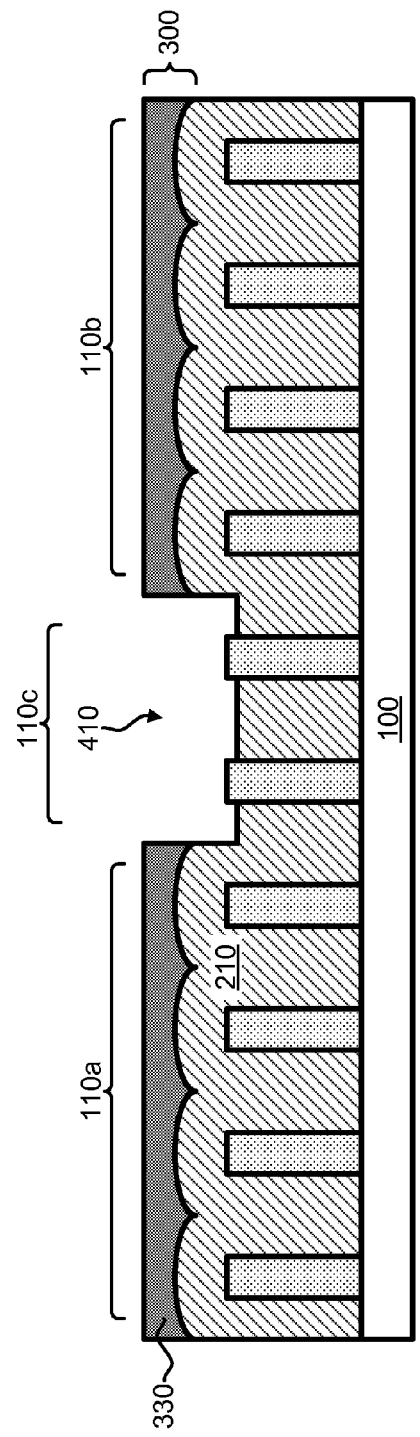

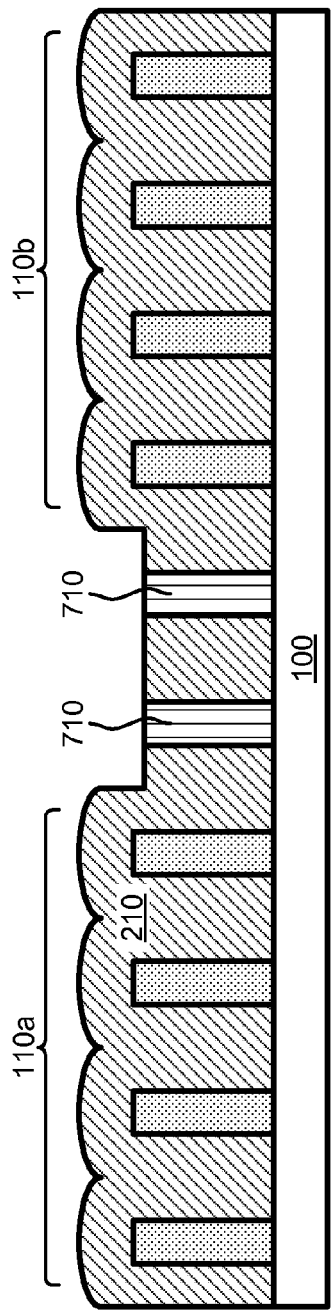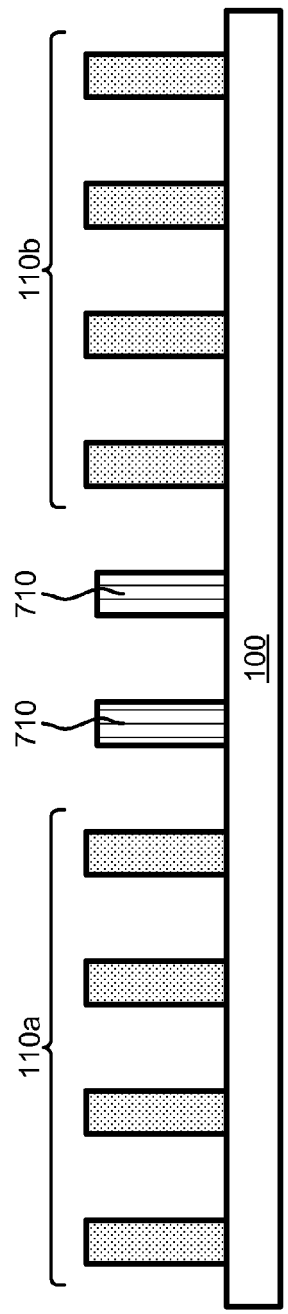

METHOD OF FORMING SEMICONDUCTOR FINS AND INSULATING FENCE FINS ON A SAME SUBSTRATE

BACKGROUND

The present invention relates to semiconductor devices, and particularly to methods of fabricating one or more insulating fence fins adjacent to one or more active semiconductor fins.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region. FET structures having n-type source and drain regions may be referred to as nFETs, and FET structures having p-type source and drain regions may be referred to as pFETs.

FinFETs are an emerging technology which may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFETs may be fabricated by forming a field, or sea, of many fins and forming gates and source/drain regions over active fins.

SUMMARY

An embodiment of the invention may include a method of forming a semiconductor structure by forming a first semiconductor fin and a second inactive semiconductor fin above a substrate; depositing a masking layer above the first semiconductor fin and the second semiconductor fin; etching a trench in the masking layer exposing the second semiconductor fin while the first semiconductor fin remains covered by the masking layer; removing the second semiconductor fin to form a fin recess beneath the trench; filling the fin recess with an insulating material to form an insulating fence fin; and removing the masking layer to expose the first semiconductor fin and the insulating fence fin.

In another embodiment of the invention, a pFET fin region may be isolated from an nFET fin region by forming one or more semiconductor fins between the pFET fin region and the nFET fin region; masking the pFET fin region, the nFET fin region, and the one or more semiconductor fins with a masking layer; exposing the one or more semiconductor fins through a trench in the masking layer, but not exposing the pFET fin region or the nFET fin region; etching the one or more semiconductor fins to deepen the trench; filling the trench with an insulating material; etching the insulating material to form one or more insulating fins in the space vacated by the one or more semiconductor fins; and removing the masking layer.

In another embodiment of the invention, a semiconductor structure may include a first fin region of one or more first semiconductor fins on a substrate; a second fin region of one or more second semiconductor fins on the substrate; and an electrically inactive fence fin region of one or more dielectric fins on the substrate separating the first fin region from the second fin region. The first fin region may include a plurality of nFET devices, while the second fin region may include a plurality of pFET devices. The dielectric fins, the first semiconductor fins, and the second semiconductor fins may all have approximately the same height.

BRIEF DESCRIPTION OF THE SEVERAL VIEWS OF THE DRAWINGS

FIG. 3 is a side view depicting forming a photolithography stack above the masking layer, according an embodiment of the present invention;

FIG. 4 is a side view depicting forming a trench in the photolithography stack, according an embodiment of the present invention;

FIG. 5 is a side view depicting removing portions of the photolithography stack, according an embodiment of the present invention;

FIG. 6 is a side view depicting etching the masking layer to expose the inactive fins, according an embodiment of the present invention;

FIG. 9 is a side view depicting removing the insulating material from the trench, according an embodiment of the present invention; and FIG. 10 is a side view depicting removing the masking layer, according an embodiment of the present invention.

Figure 1:
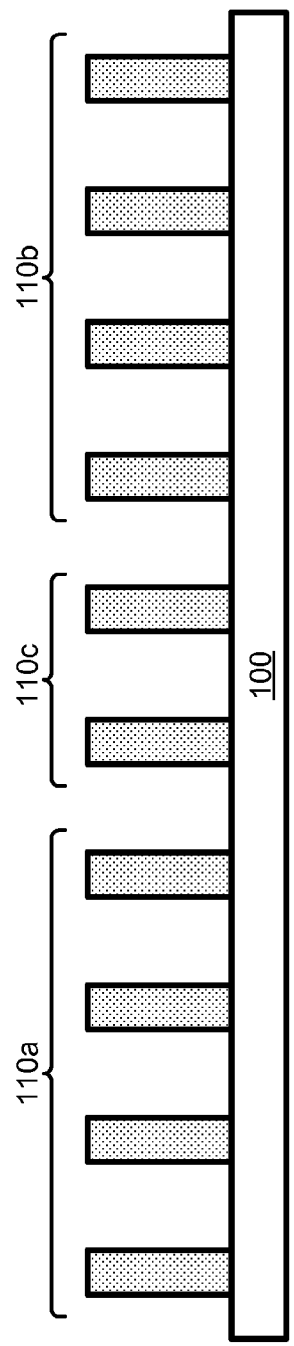
FIG. 1 is a side view depicting forming a plurality of fins, including pFET fins, nFET fins, and inactive fins, above an insulating layer, according an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FinFETs may be fabricated by forming a field, or sea, of many fins and forming gates and source/drain regions over active fins. One or more inactive fins may be left adjacent to the active fins to improve isolation between the active fins and adjacent devices, among other reasons. In some cases, the source/drain regions may be formed by epitaxially growing semiconductor materials. The following description describes embodiments of replacing one or more semiconductor fins with dielectric fence fins to, among other uses, potentially prevent epitaxial growth on the inactive fins. Further, replacing an inactive semiconductor fin with a dielectric fin may help isolate adjacent devices while maintaining uniform device topography.

Referring to FIG. 1, a plurality of semiconductor fins may be formed above a substrate 100. The plurality of fins may include pFET fins 110a, nFET fins 110b, and inactive fins 110c (hereinafter collectively referred to as "the fins"). While each of the pFET fins 110a, nFET fins 110b, and inactive fins 110c are shown to include multiple fins, only one fin may be present. The inactive fins 110c may be any number of fins between one or more fins where pFET devices are to be fabricated (i.e., the pFET fins 110a) and one or more fins where nFET devices are to be fabricated (i.e., the nFET fins 110b), where the region of the inactive fins 110c may isolate the pFET fins 110a from the nFET fins 110b.

Each of the fins may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Each of the fins may have a width ranging from approximately 2 nm to approximately 40 nm, preferably approximately 4 nm to approximately 20 nm; a height ranging from approximately 5 nm to approximately 300 nm, preferably approximately 10 nm to approximately 80 nm, though lesser and greater widths and heights are expressly contemplated.

The fins may be formed by removing material from a semiconductor layer (not shown) above the substrate 100 by, for example, a photolithography process followed by an anisotropic etching process such as reactive ion etching (RIE) or plasma etching. Other methods of forming fins known in the art may also be utilized, such as sidewall image transfer (SIT). In some embodiments, the semiconductor layer and the substrate 100 may be part of a same bulk semiconductor substrate (not shown), in which case they may not be a distinguishable boundary between the substrate 100 and the fins. In other embodiments, the semiconductor layer and the substrate 100 may be part of a semiconductor-on-insulator (SOI) substrate, wherein the substrate 100 is made of an insulating material and electrically isolates each of the fins from any adjacent fins. The substrate 100 may also be a local shallow trench isolation (STI) region beneath the fins. In a preferred embodiment, the substrate 100 may be either the buried oxide layer of a SOI substrate or a local STI region.

Figure 2:
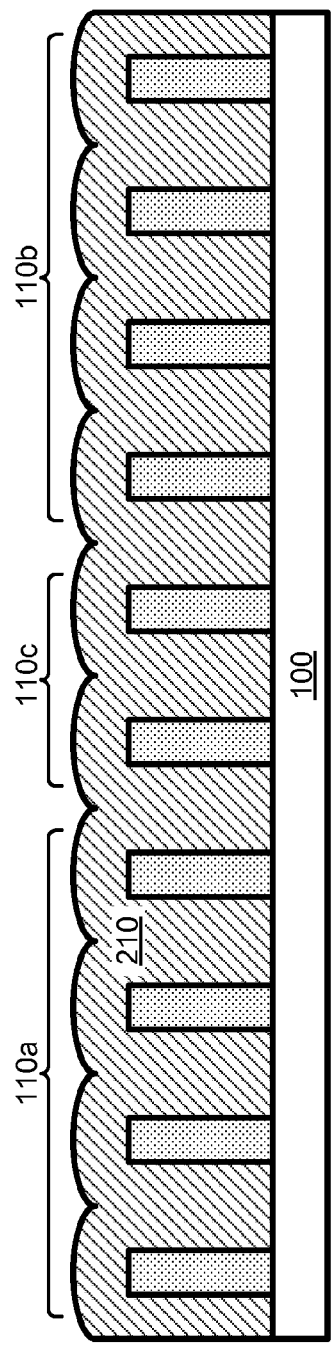
FIG. 2 is a side view depicting forming a masking layer above the plurality of fins, according an embodiment of the present invention.

Referring to FIG. 2, a masking layer 210 may be deposited over the fins so that the masking layer 210 fully covers the fins. In an exemplary embodiment, the masking layer 210 may have a thickness measured from the top surfaces of the fins ranging from approximately 5 nm to approximately 20 nm, though greater and lesser thicknesses are explicitly contemplated. Because of the uneven topography of the fins, the masking layer 210 may not have a planar top surface, and the thickness of the masking layer may be understood as an average thickness across the masking layer 210. The masking layer 210 may be made of any suitable material that may be deposited over the fins and subsequently etched selectively to the semiconductor material of the fins. In an exemplary embodiment, the masking layer 210 may be made of an insulating material such as silicon nitride. Alternatively, the masking layer 210 may also be made of any other suitable material, such as silicon carbon nitride.

Referring to FIG. 3, a photolithography stack 300 may be formed above the masking layer 210. The photolithography stack 300 may include a photoresist layer 310, as well as any number of other layers used in conjunction with the photoresist layer 310, such as an anti-reflective coating (ARC) layer 320 and an organic planarization layer (OPL) 330. Because the masking layer 210 may not have a smooth top surface due to the uneven topography of the fins, the OPL 330 may be used to provide a flat surface on which the ARC layer 320 and photoresist layer 310 may be deposited. One or more additional hard mask layers (not shown) may also be included in the photolithography stack 300.

Referring to FIG. 4, the photolithography stack 300 may be patterned to form a trench 410 exposing a portion of the masking layer 210. The trench 410 may expose a portion of the masking layer 210 above the inactive fins 110c, but not above the pFET fins 110a or the nFET fins 110b. In an exemplary embodiment, the left and right edges of trench 410 will be aligned approximately halfway between the outermost inactive fin and the adjacent pFET fin 110a or the nFET fin 110b. In other embodiments, the edges of the trench 410 may be horizontally aligned nearer to or further from the outermost inactive fin 110c, but not directly above the outermost inactive fin 110c or any of the pFET fins 110a or the nFET fins 110b.

Referring to FIG. 5, some portions of the photolithography stack 300 may be removed prior to proceeding to subsequent etching steps while the pFET fins 110a and the nFET fins 110b remain masked by a remaining portion of the photolithography stack 300. The thickness of the remaining portion of the photolithography stack 300 may be sufficient to protect the pFET fins 110a and the nFET fins 110b from subsequent etching processes. In the embodiment depicted in FIG. 5, the pFET fins 110a and the nFET fins 110b remain masked by the OPL 330 while the photoresist layer 310 and the ARC layer 320 are removed. In other embodiments, an additional hard mask layer (not shown) may remain in addition to, or instead of, the OPL 330.

Referring to FIG. 6, the masking layer 210 may be etched using the photolithography stack 300 as a mask to deepen the trench 410, so that the trench 410 exposes the inactive fins 110c while the pFET fins 110a and the nFET fins 110b remain covered by the masking layer 210. In some embodiments, the trench may be overetched by some degree, so that the bottom surface of the trench is at a height less than the height of the inactive fins 110c, however in a preferred embodiment the amount of this overetch may be minimized so that the top surfaces of the inactive fins 110c are approximately coplanar with the bottom surface of the trench 410.

The masking layer 210 may be etched using any suitable anisotropic etching process capable of selectively etching the masking layer 210 without substantially removing material from the inactive fins 110c, for example RIE or plasma etching. In some embodiments, the photolithography stack 300 and the masking layer 210 may be etched outside of the trench 410, as long as the pFET fins 110a and the nFET fins 110b remain covered by the masking layer 210. It should be noted that the trench 410 exposing the inactive fins 110c may be formed by any suitable method in the art, and the process of forming a photolithographic stack above a masking, patterning the photolithographic stack, and forming a trench in the masking layer described above in conjunction with FIGS. 3-6 is merely exemplary.

Figure 7:
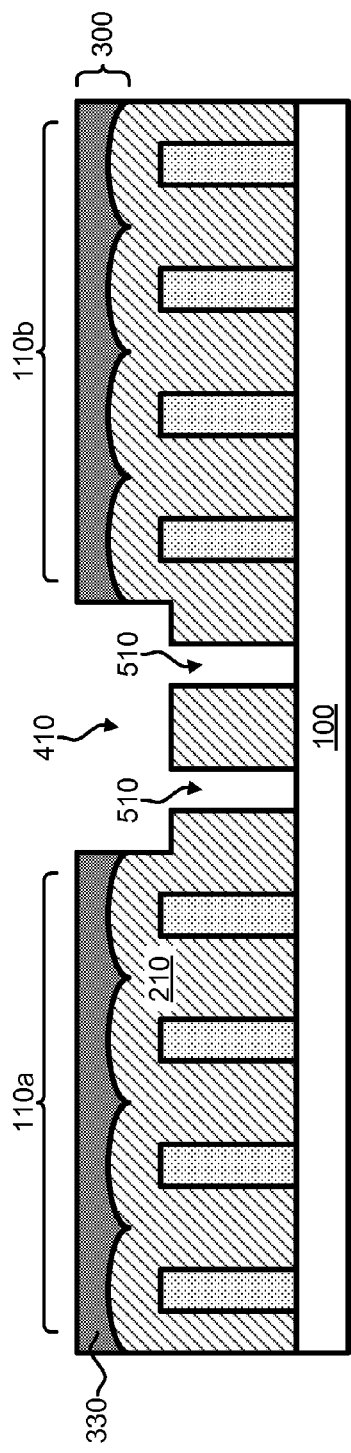
FIG. 7 is a side view depicting removing the inactive fins to form fin recesses according an embodiment of the present invention.

Referring to FIG. 7, the inactive fins 110c (FIG. 6) may be removed to form fin recesses 510 in the masking layer 210. The inactive fins 110c may be removed using any suitable etch process capable of selectively removing the semiconductor material of the inactive fins 110c without substantially removing the material of the masking layer 210. The etch process may be either wet or dry and anisotropic or isotropic. In an exemplary embodiment where the masking layer 210 is made of nitride and the inactive fins 110c are made of silicon, the inactive fins 110c may be removed using a wet etch process with dilute hydrofluoric acid. By forming the trench 410 in the masking layer 210 prior to removing the inactive fins 110c, the etch process may be self aligned to the trench 410 and not require any additional photolithography steps.

Figure 8:
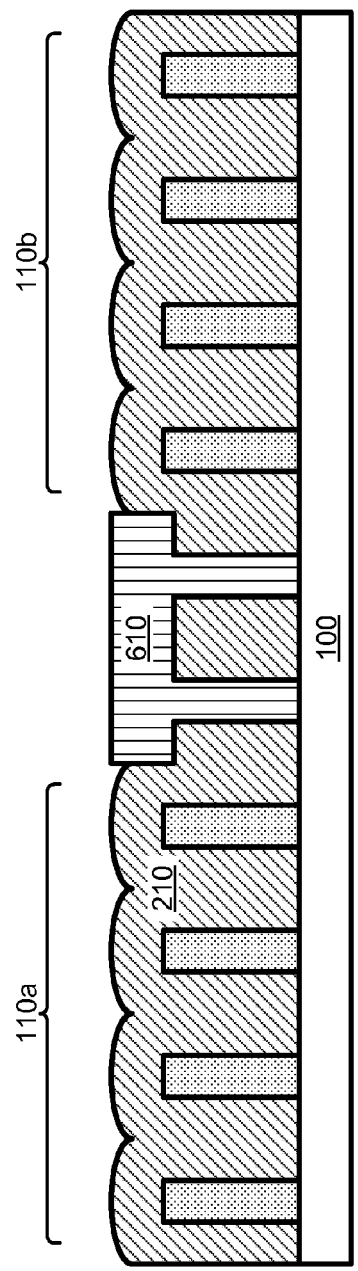
FIG. 8 is a side view depicting filling the fin recesses and trench with an insulating material and removing the remaining portions of the photolithography layer, according an embodiment of the present invention.

Referring to FIG. 8, the fin recesses 510 (FIG. 7) may be filled with an insulating material to form an insulating region 610. The fin recesses 510 may be overfilled so that the insulating material also fills the trench 410 (FIG. 7). The insulating material may be any dielectric material capable of being deposited into the fin recesses 510, where the masking layer 210 may be etched selective to the dielectric material. In an exemplary embodiment where the masking layer 210 is made of nitride, the dielectric material may be silicon oxide. The oxide may be deposited using a flowable chemical vapor deposition (FCVD) process, by first depositing a silicon precursor such as trisilylamine [TSA, $(SiH_3)_3N$] with an oxygen ($O_2$) and ammonia ($NH_3$) mixture. The TSA may be deposited at temperatures below approximately 50° C. to enhance formation of short-chain polymers on the surface of the structure resulting in a liquid-like flowable film capable of filling dense, high-aspect ratio re-entrant profiles, such as fin recesses 510. After the low temperature deposition of TSA, the wafer may be steam annealed between approximately 350 to approximately 550° C. for approximately 2 to approximately 4 hours to allow dehydrogenation and denitrogenation of TSA leading to formation of silicon oxide ($SiO_2$) capable of filling fin recesses 510 without leaving a substantial volume of voids. Any other suitable process may be used to fill the fin recesses 510. The OPL 330 may be removed either before or after filling the fin recesses 510. In the event that the insulating material overfills the trench 410, a chemical-mechanical planarization (CMP, also referred to as chemical-mechanical polishing) process may be used to remove excess insulating material from above the masking layer 210.

Referring to FIG. 9, the insulating region 610 (FIG. 8) may be etched so that any insulating material is removed from the trench 410 (FIG. 7), leaving insulating material only in the fin recesses 510 (FIG. 7). The remaining portions of the insulating region 610 may form insulating fins 710. The insulating region 610 may be etched using any suitable controlled wet or dry etching process capable of removing the insulating material is removed from the trench 410 without substantially etching the masking layer 210 or the insulating material in the fin recesses 510 (FIG. 7). In some embodiments, the insulating material in the fin recesses 510 may be partially etched, though in a preferred embodiment no insulating material is removed from the fin recesses. In an exemplary embodiment where the insulating region 610 is made of oxide and the masking layer 210 is made of nitride, the insulating region 610 may be etched by a wet etch process with dilute hydrofluoric acid, a dry plasma etch with $C_4F_8$, $C_4F_6$, or $C_5HF_7$ gas, or a mixture thereof, mixed with $CF_4$, $NH_3$, or $SF_6$, or mixtures thereof, or a dry vapor phase etch with a mixture of $NH_3$ and HF gas.

Referring to FIG. 10, the masking layer 210 may be removed to expose the pFET fins 110a, the nFET fins 110b, and the insulating fins 710. The masking layer may be removed using any exemplary etching process capable of selectively removing the masking layer without substantially etching the pFET fins 110a, the nFET fins 110b, and the insulating fence fins 710. For example, in an embodiment where the pFET fins 110a and the nFET fins 110b are made of silicon, the insulating fins 710 are made of oxide, and the masking layer 210 is made of nitride, the masking layer 210 may be removed by a wet etch process using hot phosphorus acid.

After removing the masking layer 210, the pFET fins 110a, the nFET fins 110b, and the insulating fins 710 remain on the substrate, ready for subsequent processing to form pFET devices above the pFET fins 110a and nFET devices above the nFET fins 110b, with the insulating fins 710 forming an electrically inactive fence fin region isolating the pFET devices from the nFET devices. Because the insulating fins 710 may have approximately the same height as the pFET fins 110a and the nFET fins 110b, the fence fin region may have approximately the same topography as the pFET devices and the nFET devices, allowing for more uniform fabrication. Further, because the inactive fins 710 may be made of an insulating material rather than a semiconductor material, material growth on the inactive fins 710 may be avoided during subsequent semiconductor growth processes, including, for example, forming source and drain regions on the pFET fins 110a and the nFET fins 110b (not shown). By restricting the open space adjacent to the pFET fins 110a and the nFET fins 110b, the insulating fins 710 may restrict the growth of semiconductor material on the pFET fins 110a and the nFET fins 110b, potentially leading to a more controllable fabrication process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A method of forming a semiconductor structure, the method comprising:
   forming a first semiconductor fin and a second semiconductor fin above a substrate, wherein the second semiconductor fin comprises an inactive fin;
   depositing a masking layer above the first semiconductor fin and the second semiconductor fin;
   etching a trench in the masking layer exposing the second semiconductor fin while the first semiconductor fin remains covered by the masking layer;
   removing the second semiconductor fin to form a fin recess beneath the trench;
   filling the fin recess with an insulating material to form an insulating fence fin; and
   removing the masking layer to expose the first semiconductor fin and the insulating fence fin.

2. The method of claim 1, further comprising forming a third semiconductor fin separated from the first semiconductor fin by the second semiconductor fin prior to depositing the masking layer, wherein the first semiconductor fin comprises a pFET fin and the third semiconductor fin comprises an nFET fin, wherein the masking layer covers the third semiconductor fin.

3. The method of claim 1, wherein etching a trench in the masking layer comprises:
   depositing a photolithographic stack above the masking layer, the photolithographic stack comprising an organic planarization layer and a photoresist layer;
   patterning the photolithographic stack to expose a portion of the masking layer; and
   etching the masking layer using an anisotropic etch process using the patterned photolithographic stack as a mask.

4. The method of claim 1, wherein etching a trench in the masking layer comprises etching a trench having an edge between the first semiconductor fin and the second semiconductor fin.

5. The method of claim 4, wherein the edge is approximately halfway between the first semiconductor fin and the second semiconductor fin.

6. The method of claim 1, further comprising forming a third semiconductor fin separated from the first semiconductor fin by the second semiconductor fin, wherein the third semiconductor fin is covered by the masking layer while etching the trench in the masking layer, removing the second semiconductor fin, and filling the trench with the insulating material.

7. The method of claim 1, wherein filling the fin recess with an insulating material to form an insulating fence fin comprises depositing a flowable oxide in the fin recess.

8. The method of claim 7, wherein depositing a flowable oxide in the fin recess comprises depositing trisilylamine in the fin recess via a chemical vapor deposition process with an oxygen and ammonia mixture; and steam-annealing the fin recess.

9. A method of isolating a pFET fin region from an nFET fin region, the method comprising:
   forming one or more semiconductor fins between the pFET fin region and the nFET fin region;
   masking the pFET fin region, the nFET fin region, and the one or more semiconductor fins with a masking layer;
   exposing the one or more semiconductor fins through a trench in the masking layer, wherein the trench does not expose the pFET fin region or the nFET fin region;
   etching the one or more semiconductor fins to deepen the trench;
   filling the trench with an insulating material;
   etching the insulating material to form one or more insulating fins in the space vacated by the one or more semiconductor fins; and
   removing the masking layer.

10. The method of claim 9, wherein the pFET fin region and the nFET fin region each comprise one or more semiconductor fins.

11. The method of claim 9, wherein exposing the one or more semiconductor fins through a trench in the masking layer comprises:
    depositing a photolithographic stack above the masking layer, the photolithographic stack comprising an organic planarization layer and a photoresist layer;
    patterning the photolithographic stack to expose a portion of the masking layer; and
    etching the masking layer using an anisotropic etch process using the patterned photolithographic stack as a mask.

12. The method of claim 9, wherein exposing the one or more semiconductor fins through a trench in the masking layer comprises forming a trench having a first edge between a first outermost fin of the one or more semiconductor fins and an adjacent semiconductor fin of the nFET fin region and a second edge between the a second outermost fin of the one or more semiconductor fins and an adjacent semiconductor fin of the pFET fin region.

13. The method of claim 12, wherein the one or more semiconductor fins comprises a single fin and the first outermost fin and the second outermost fin comprise the same fin.

14. The method of claim 9, wherein filling the trench with an insulating material comprises depositing a flowable oxide in the trench.

15. The method of claim 14, wherein depositing a flowable oxide in the trench comprises depositing trisilylamine in the trench via a chemical vapor deposition process with an oxygen and ammonia mixture; and steam-annealing the trench.

* * * * *